United States Patent [19]
Van Tran

[11] Patent Number: 4,567,389

[45] Date of Patent: Jan. 28, 1986

[54] CMOS DIFFERENTIAL AMPLIFIER

[75] Inventor: Hiep Van Tran, Carrollton, Tex.

[73] Assignee: Mostek Corporation, Carrollton, Tex.

[21] Appl. No.: 627,998

[22] Filed: Jul. 5, 1984

[51] Int. Cl.[4] .......................... G11C 7/00; H03F 3/45
[52] U.S. Cl. ..................................... 307/530; 330/253
[58] Field of Search ............... 330/253, 258; 307/530; 365/190, 207, 208

[56] References Cited

U.S. PATENT DOCUMENTS 4,247,824 1/1981 Hilbourne ..................... 330/253

*Primary Examiner*—James B. Mullins
*Attorney, Agent, or Firm*—Eric W. Petraske

[57] ABSTRACT

A differential sense amplifier employs a central region having two current paths each having a P- and N-type transistor in series, all four transistors having a common gate connection. Each input transistor has its source connected to the top of one current path and its drain connected to the bottom of the other current path, to apply the maximum differential input.

6 Claims, 5 Drawing Figures

CMOS DIFFERENTIAL AMPLIFIER

DESCRIPTION

1. Technical Field

The field of the invention is that of integrated circuit amplifiers employing the CMOS process.

2. Background Art

A standard practice in the fabrication and design of CMOS static RAM is a provision of a bit line that has a voltage close to Vcc in order to have a large voltage margin above the trip point of the memory cells. In order to provide optimum performance, it is useful to have the common mode output voltage of the sense amp be set at the trip point at the next stage in the circuit—typically at a value of Vcc/2.

If the typical sense amplifier circuit of the prior art is used, the input transistors of the sense amplifier will have their gates at the voltage of the bit line and their drains at the output voltage so that they will be heavily into the linear region of operation. This results in unsatisfactory performance or rather performance only over a limited range of common mode input voltage.

The problem addressed by this invention is that of providing a sense amplifier that produces reasonable gain over a broad range of common mode input voltages and that will also operate well with modern (low doping of the source and drain) transistors which have a relatively high impedance.

DISCLOSURE OF INVENTION

The invention relates to an improved CMOS sense amplifier that incorporates cross-coupling of both inputs to either end of both current paths through the central portion of the amplifier.

A feature of the invention is the provision of matched pairs of complementary transistors, all having a common gate.

Another feature of the invention is coupling of an input signal to both sides of a central amplifier portion through both the source and drain of an input transistor.

BEST MODE FOR CARRYING OUT THE INVENTION

Figure 1:
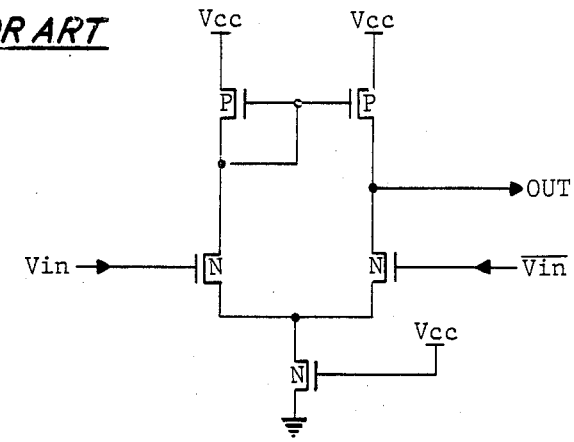
FIG. 1 illustrates a prior art sense amplifier.
Figure 2A:
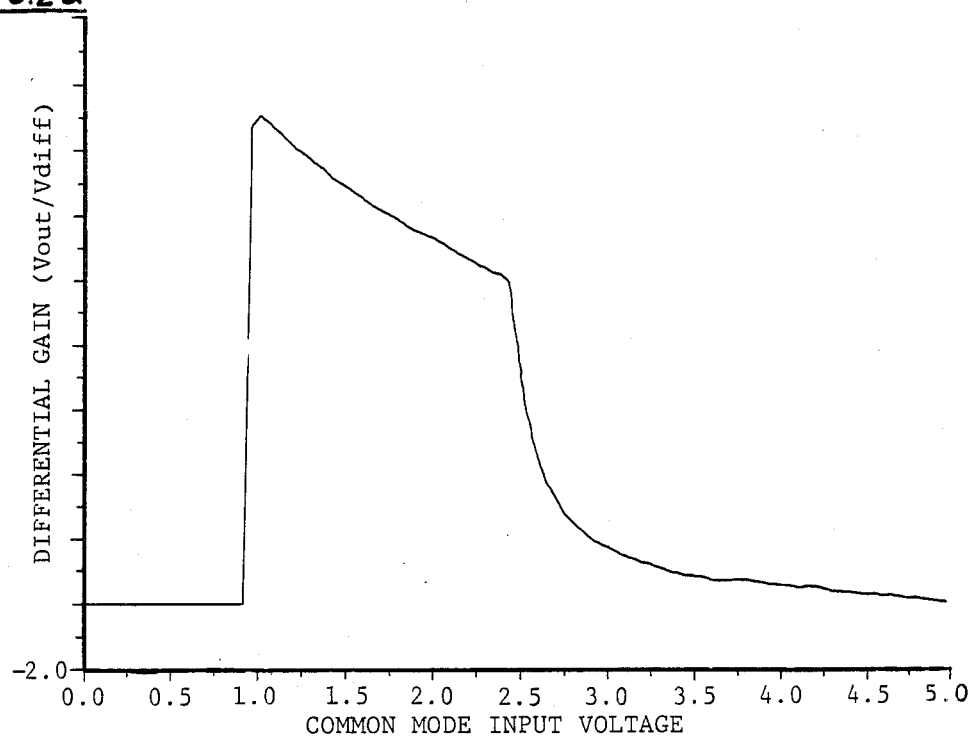
FIGS. 2a and 2b illustrate the dependence of gain upon common mode voltage for both the subject invention and a standard prior art amplifier.

FIG. 1 illustrates a prior art sense amplifier having two pairs of complementary transistors. As was noted above, this amplifier is able to provide reasonable gain for only a small range of common mode voltages. FIG. 2a illustrates the calculated dependence of gain on voltage for this amplifier, showing reasonable gain only in a small range. This amplifier features the provision of two P channel transistors having a common gate that is connected to a node on the left side of the figure, opposite to the output node.

Figure 3:
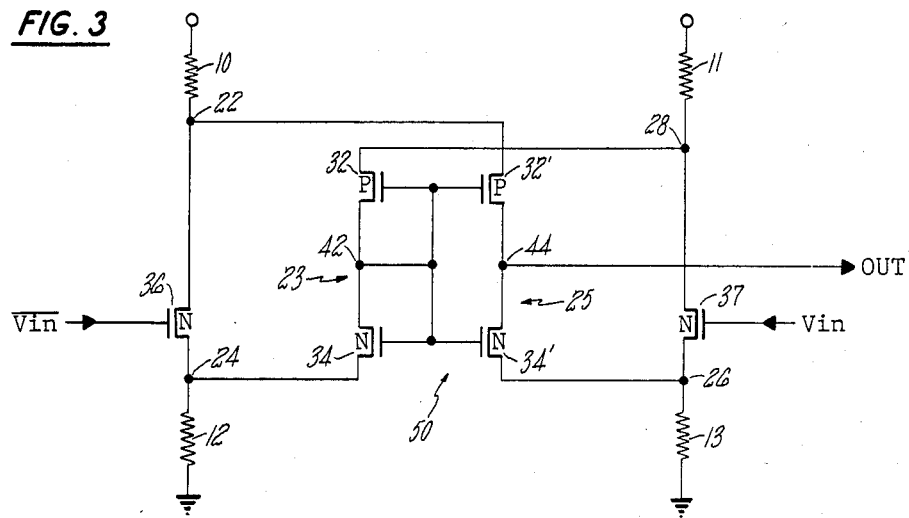
FIG. 3 illustrates a sense amplifier constructed according to the invention.

FIG. 3 illustrates a circuit constructed according to the invention, in which a central portion denoted by the numeral 50 consists of matched pairs of P channel and N channel transistors, all having a common gate. Each input is connected to both ends of a current path extending diagonally across the figure and being denoted by the numerals 23 and 25 respectively (Path 23 includes resistor 11, transistors 32 and 34 and resistor 12). For purposes of illustration, a simplified embodiment of the invention in which all the resistors 10, 11, 12 and 13 have the same value and in which all four transistors 32, 32' and 34, 34' have the same transconductance. Those skilled in the art will readily be able to modify and generalize this particular example.

In operation, the equality of the resistors and the equality of gain of the transistors ensures that, when $V_{in}=\overline{V_{in}}$, node 44, the output node, has a steady state voltage of Vcc/2. By symmetry, the voltage between Vcc and ground will be divided equally between an upper portion consisting of resistor 10, and transistor 32' and a lower portion consisting of transistor 34' and resistor 13. Similarly, node 42 on current path 23 will also be at Vcc/2.

When connection is made to the memory cell, one of the two inputs will go up and the other down by a small amount. Thus one of transistors 36 and 37 will be turned on to a slightly greater degree and the other will be turned on to a slightly lesser degree. This change in the degree of turn-on will change the voltage on nodes 24 and 26 which are the sources of transistors 36 and 37 respectively and also on nodes 22 and 28, which are the drains.

Node 24 follows the signal $\overline{V_{in}}$ while node 26 follows signal $V_{in}$. Also, node 22 is the inverse of $\overline{V_{in}}$ and node 28 is the inverse of $V_{in}$. The change in input will apply corresponding changes to either end of current paths 23 and 25. For example, nodes 24 and 28, at opposite ends of current path 23, will move in phase to increase or decrease in voltage at the same time (similarly for nodes 22 and 26 on opposite ends of current path 25).

If Vin rises, (turning on transistor 37 to a greater degree so that the voltage on node 26 rises and the voltage on node 28 drops, then the voltage on node 42 will decrease. Thus, the gate to source voltage on transistor 34 will decrease and the gate to source voltage on transistor 32' will increase. This will effect the common gate voltage of all four transistors of central portion 50 and the result will be that the voltage on node 44 will increase.

Figure 2B:
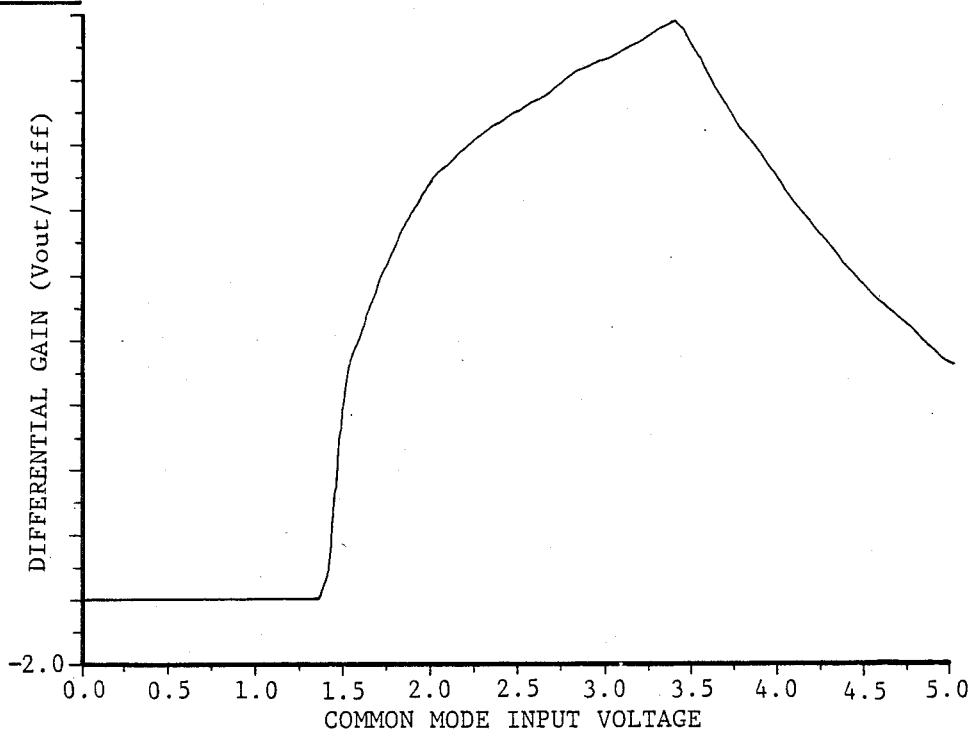

In a small signal approximation, the voltage of node 44 may be expressed in terms of the voltage difference on the two inputs and the transistor gains as the quantity $$V_{44}=2V_{diff}g_{in}\cdot g_{out}R\cdot R_{out}/(1+Rg_{in})(1-Rg_{out})$$

where $V_{diff}$ is the voltage difference of the two inputs; $g_{in}$ is the gain of the input transistors, $g_{out}$ is the gain of the output transistors, R is the resistance of each of the four resistors 10–13 and $R_{out}$ is the impedance of the output circuit. The derivation of this result is a straightforward application of circuit theory and need not be reproduced here. It is striking, however, that in this approximation the output voltage is independent of the common mode input voltage. FIG. 2b plots the differential gain of the sense amplifier versus common mode input voltage. Comparison with the calculated gain (FIG. 2a) of the prior art amplifier of FIG. 1 shows that the usable range has been greatly extended. The relatively slow dependence of differential gain on common mode voltage in this more detailed calculation is essentially the dependence of the transconductance of the input transistor.

If it is desired to stress the performance of the amplifier at high values of common-mode input voltage, the pull up resistors 10 and 11 may be decreased in value. The value of resistors 12 and 13 may then be set to achieve the desired gain. A small value of pull up resistor will keep the $V_{ds}$ of the input transistor high and prevent those input transistors from entering too deeply into the linear region. Such a circuit will then have some dependence of output voltage on the input common mode voltage.

It is worth noting that the gain of the amplifier is a function of the values of resistors 10 through 13. If these resistors are replaced by load transistors, then the provision of adjustable voltage means on gates of these load transistors will enable the gain of the amplifier to be adjusted. Those skilled in the art will readily appreciate the flexibility provided by this feature. In particular, if the voltage circuit supplying the gates of one or more transistors is adjustable by means of fuses or other conventional means, then the circuit may be tested after its manufacture is completed and the gain may be trimmed to provide a desired level of performance.

Figure 4:
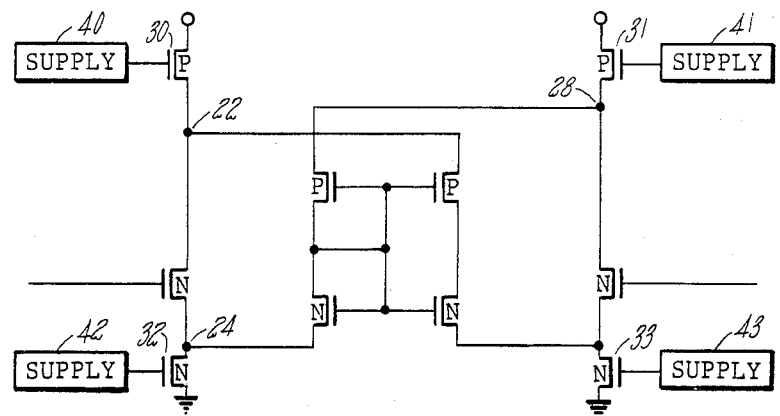
FIG. 4 illustrates an alternative embodiment of the invention.

FIG. 4 illustrates an alternative embodiment of the invention, in which the only changes are the replacement of resistors 10–13 by load transistors 30–33 and corresponding voltage supply circuits 40–43. The load transistors may be of any convenient type—P or N channel and the supply circuits may range from a direct connection to Vcc to an adjustable supply circuit. One supply circuit may be used for more than one transistor, of course. The arrangement illustrated offers the maximum flexibility.

Although the invention has been disclosed in the context of a static RAM, it may be used in any other circuit, such as telecommunications circuits and linear circuitry.

I claim:

1. A field-effect-transistor sense amplifier for responding to first and second input signals comprising:
    a first side comprising a first upper transistor and a first lower transistor connected in series in a first current path between a supply voltage and ground, the drain of said first lower transistor being connected to the source of said first upper transistor at a gate node; and
    a second side comprising a second upper transistor and a second lower transistor, connected in series in a second current path between said supply voltage and ground, the drain of said second lower transistor being connected to the source of said second upper transistor at an output node; characterized in that:
    all of the gates of said first and second upper and lower transistors are connected to said gate node and said amplifier further includes;
    first input means responsive to said first input signal for applying opposite-sense signals to the drain of said second upper transistor and the source of said first lower transistor; and
    second input means responsive to said second input signal for applying opposite-sense signals to the drain of said first upper transistor and the source of said second lower transistor, whereby each of said first and second input means couples signals to both of said first and second sides.

2. A sense amplifier according to claim 1, further characterized in that said first current path includes a first upper load means connected between said supply voltage and said first upper transistor and a first lower load means connected between said first lower transistor and ground; and
    said second current path includes a second upper load means connected between said supply voltage and said second upper transistor and a second lower load means connected between said second lower transistor and ground.

3. An amplifier according to claim 2, in which all of said first and second upper and lower load means have the same impedance value and all of said first and second upper and lower transistors have the same transconductance.

4. An amplifier according to claim 2, in which said first and second upper load means have an impedance value substantially below the impedance value of said first and second lower load means, whereby said amplifier exhibits improved tolerance of high common-mode input voltages.

5. An amplifier according to claim 2, in which at least one of said first and second upper load means further includes means for varying the impedance of said at least one load means, whereby the amplifier may be adjusted to compensate for processing or other variations.

6. An amplifier according to claim 5, in which said at least one load means is a load transistor having a load transistor gate and said means for varying is a variable power supply connected to said load transistor gate.

* * * * *